United States Patent
Luttikhuis et al.

(10) Patent No.: US 7,522,258 B2
(45) Date of Patent: Apr. 21, 2009

(54) LITHOGRAPHIC APPARATUS AND DEVICE MANUFACTURING METHOD UTILIZING MOVEMENT OF CLEAN AIR TO REDUCE CONTAMINATION

(75) Inventors: Bernardus Antonius Johannes Luttikhuis, Nuenen (NL); Petrus Rutgerus Bartray, Ysselsteyn (NL); Wilhelmus Josephus Box, Eksel (BE); Marco Koert Stavenga, Eindhoven (NL); Thijs Harink, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 329 days.

(21) Appl. No.: 11/169,305

(22) Filed: Jun. 29, 2005

(65) Prior Publication Data
US 2007/0002297 A1    Jan. 4, 2007

(51) Int. Cl.
G03B 27/52 (2006.01)
G03B 27/58 (2006.01)

(52) U.S. Cl. .......................... 355/30; 355/72
(58) Field of Classification Search .......... 355/30, 355/53, 72–76; 250/548; 356/237.2
See application file for complete search history.

(56) References Cited

U.S. PATENT DOCUMENTS

| | | | |
|---|---|---|---|
| 4,480,910 A | 11/1984 | Takanashi et al. | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,690,450 B2 | 2/2004 | Nishi | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |

(Continued)

FOREIGN PATENT DOCUMENTS

CN        1319785 A     10/2001

(Continued)

OTHER PUBLICATIONS

Translation of Office Action dated Jun. 13, 2007, for KR Patent Application No. 10-2006-0057898, 2 pgs.

(Continued)

*Primary Examiner*—Hung Henry Nguyen
(74) *Attorney, Agent, or Firm*—Sterne, Kessler, Goldstein & Fox P.L.L.C.

(57) ABSTRACT

A lithographic apparatus comprises a substrate table that supports a substrate and a substrate handler that moves the substrate relative to the substrate table. The substrate handler is adapted to load substrates on to and unload substrates from the substrate table before and after exposure. Also, a clean gas supply system supplies a clean gas to at least one location at which the substrate is located. The clean gas supply system is moveably mounted. A device manufacturing method utilizing the lithographic apparatus can be used to manufacture at least one of a flat panel display and an integrated circuit device.

35 Claims, 11 Drawing Sheets

U.S. PATENT DOCUMENTS

| | | |
|---|---|---|
| 6,811,953 B2 | 11/2004 | Hatada et al. |
| 7,106,412 B2 | 9/2006 | De Bokx et al. |
| 7,145,641 B2 * | 12/2006 | Kroon et al. .................. 355/71 |
| 2003/0224265 A1 * | 12/2003 | Okoroanyanwu ............ 430/30 |
| 2004/0041104 A1 | 3/2004 | Liebregts et al. |
| 2004/0130561 A1 | 7/2004 | Jain |
| 2005/0007572 A1 | 1/2005 | George et al. |
| 2005/0054217 A1 | 3/2005 | Klomp et al. |
| 2006/0061747 A1 * | 3/2006 | Ishii ........................... 355/53 |
| 2006/0119813 A1 * | 6/2006 | Hultermans et al. ........... 355/53 |
| 2006/0139616 A1 | 6/2006 | Jacobs et al. |
| 2006/0257553 A1 * | 11/2006 | Ohta et al. .................... 427/8 |

FOREIGN PATENT DOCUMENTS

| | | |
|---|---|---|
| EP | 0 605 103 B1 | 10/1998 |
| EP | 1 457 830 A2 | 9/2004 |
| JP | 57-153433 A | 9/1982 |
| JP | 63-157419 A | 6/1988 |
| JP | 6-124873 A | 5/1994 |
| JP | 6-168866 A | 6/1994 |
| JP | 10-303114 A | 11/1998 |
| JP | 10-340846 A | 12/1998 |
| JP | 2004/102646 A1 * | 11/2004 |
| KR | 2004-0080380 A | 9/2004 |
| WO | WO 98/33096 | 7/1998 |
| WO | WO 98/38597 | 9/1998 |
| WO | WO 99/49504 A1 | 9/1999 |
| WO | WO 2004/102646 A1 | 11/2004 |

OTHER PUBLICATIONS

Search Report for International Application No. PCT/JP2004/006853 mailed Sep. 28, 2004, 3 pgs.

* cited by examiner

LITHOGRAPHIC APPARATUS AND DEVICE MANUFACTURING METHOD UTILIZING MOVEMENT OF CLEAN AIR TO REDUCE CONTAMINATION

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate), e.g., via imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate can be rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In general, a single substrate will contain a network of adjacent target portions that are successively exposed. The substrate is disposed on a substrate exposure table or stage, during a scanning process. Unexposed substrates, i.e., those substrates that are not yet been subject to exposure, are stored in a storage device or system. A robot loads the unexposed substrates to the exposure table where they are subsequently exposed. After exposure, the exposed substrates are returned to the storage by the robot.

Lithographic apparatuses include a clean air supply which distributes clean air into the lithographic apparatus. The clean air is provided in order to maintain a clean environment within the apparatus, since contamination within the apparatus leads to imaging errors. In these lithographic apparatuses a down flow of clean air is provided by clean air supply units, which can be located in the apparatus.

In certain applications, the substrates used, for example, in the manufacture of flat panel displays, are relatively large. For example, they can have an area in excess of 1 m². It has been found that because of the relatively large image area, particle contamination is a problem. This is a particular problem for the unexposed substrates. As mentioned above, clean air is directed from above. It has been found that due to the arrangement of the substrate table and its interaction with the robot, the clean air does not efficiently reach the unexposed substrate prior to exposure. This leads to imaging errors. Furthermore, another consequence, in applications where the substrates and substrate tables are relatively large, is that the movement of the tables within the limited space of the apparatus in loading and unloading the substrates act as pumps, which can "pump" contamination particles onto the unexposed substrates. Furthermore, the moving robot gives rise to wake effects, and thus under pressure zones above the unexposed substrate, which also constitute a risk of contamination.

Therefore, what is needed is a system and method to reduce the risk of contamination within a lithographic apparatus. For example, it is desirable to reduce the risk of contamination of an unexposed substrate.

SUMMARY

In one embodiment of the present invention, there is provided a lithographic apparatus comprising a substrate table that supports a substrate and a substrate handler that moves the substrate relative to the substrate table. The substrate handler is adapted to load substrates on to and unload substrates from the substrate table before and after exposure. Also, a clean gas supply system supplies a clean gas to at least one location at which the substrate is located. The clean gas supply system is moveably mounted.

According to another embodiment of the present invention, there is provided a lithographic apparatus comprising a clean gas supply system that supplies a clean gas to an unexposed substrate in the lithographic apparatus. The clean gas supply system is located on a moving support and supplies a clean gas to at least one location at which the unexposed substrate is located.

According to a further embodiment of the present invention, there is provided a device manufacturing method comprising the following steps. Projecting a patterned beam of radiation onto a substrate. Conditioning a radiation beam. Modulating the cross-section of the radiation beam. Supporting a substrate on a substrate table. Projecting the modulated radiation beam onto a target portion of the substrate. Moving the substrate relative to the substrate table, including loading substrates on to and unloading substrates from the substrate table before and after exposure. Supplying a clean gas supply to at least one location at which a substrate is located, where the clean gas is supplied by a moveably mounted clean gas system.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the present invention and to enable a person skilled in the pertinent art to make and use the present invention.

FIGS. 5, 6a to 6g, 7, 8, and 9 depict side view representations of clean gas supply systems for a lithographic apparatus, according to various embodiment of the present invention.

Figure 10:
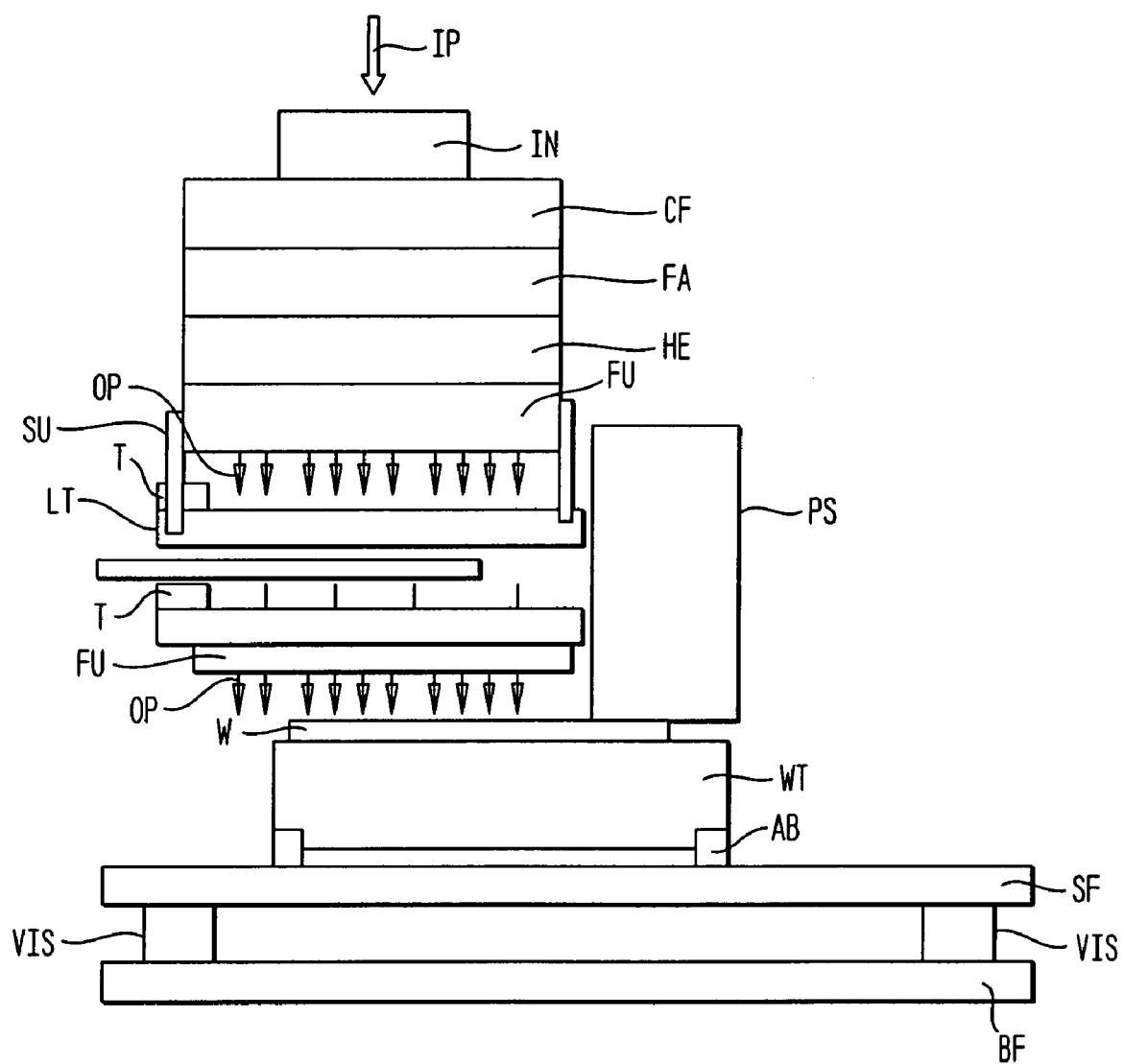

FIG. 10 shows details of a clean gas system, according to one embodiment of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
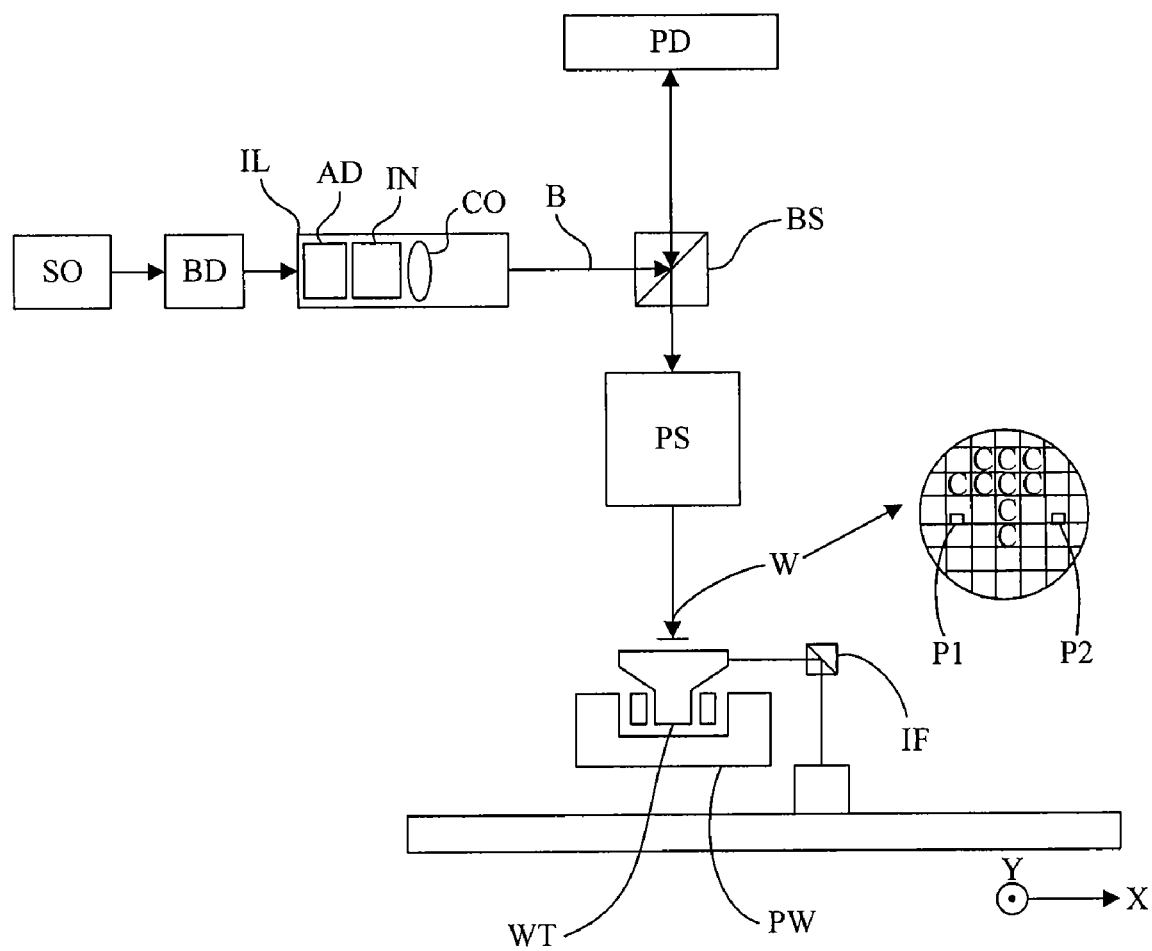
FIGS. 1 and 2 depict lithographic apparatus, according to various embodiments of the present invention.

FIG. 1 schematically depicts the lithographic apparatus of one embodiment of the present invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. In one example, the thickness of the substrate is at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
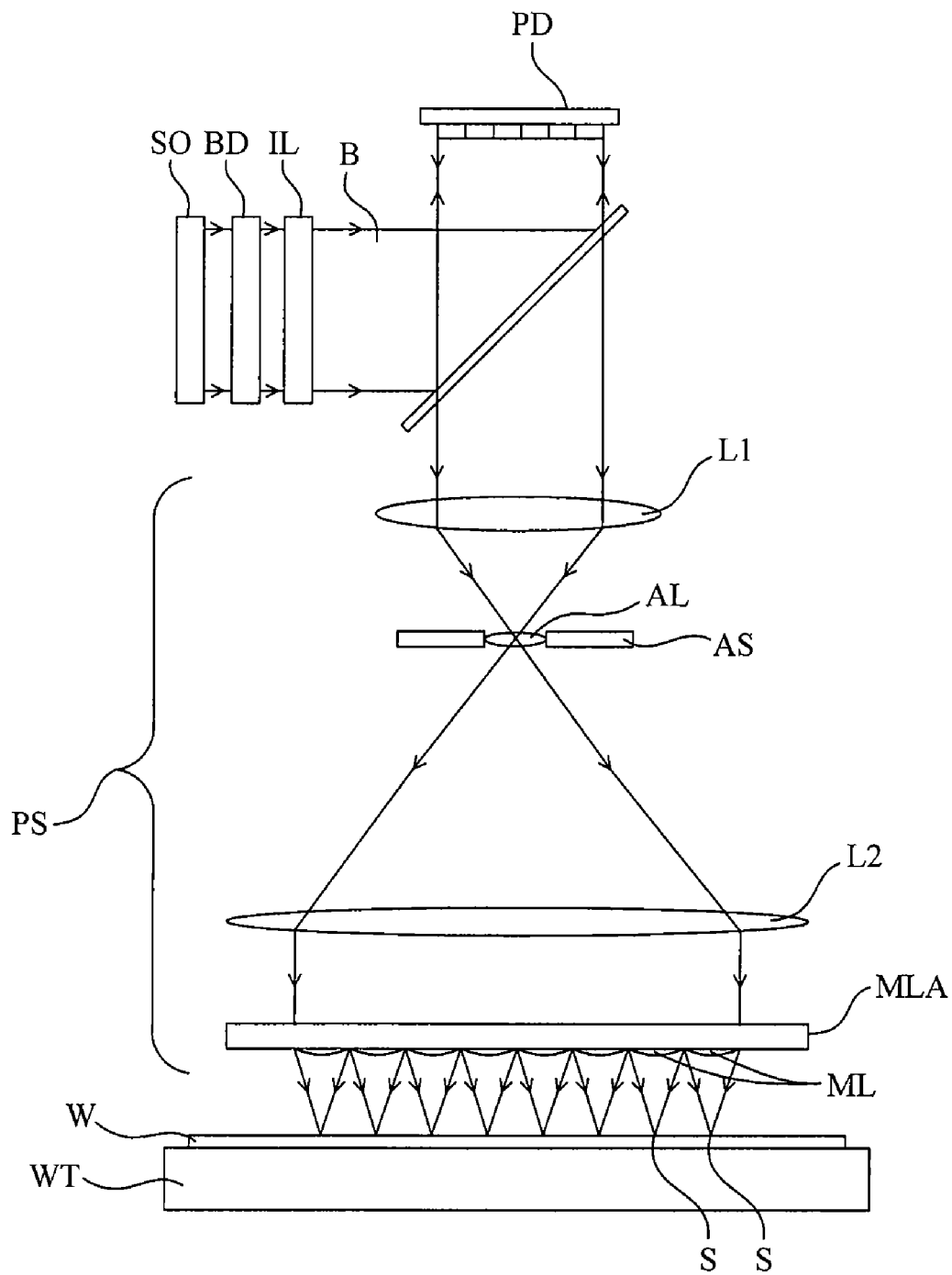

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
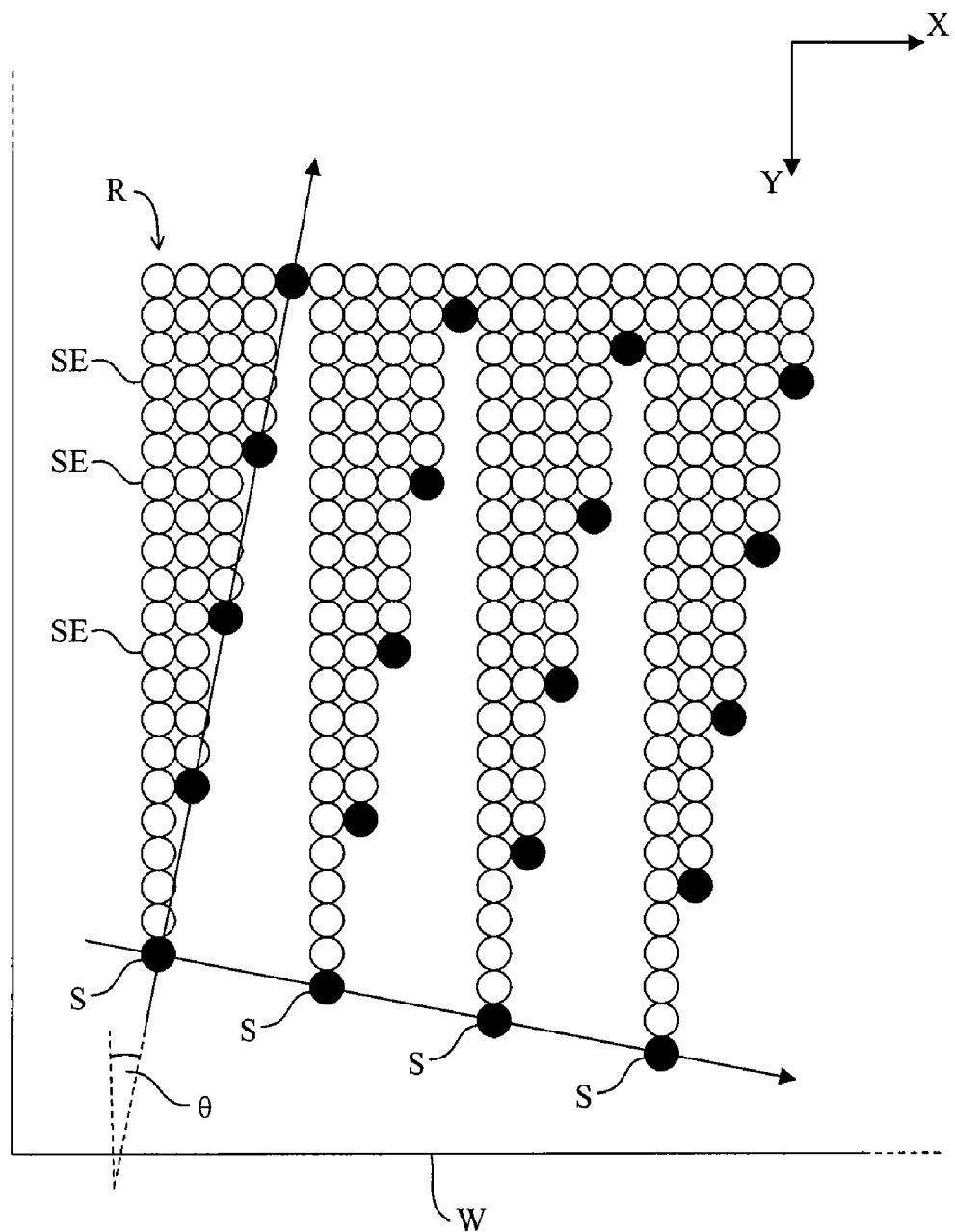
FIG. 3 depicts a mode of transferring a pattern to a substrate using an embodiment of the present invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
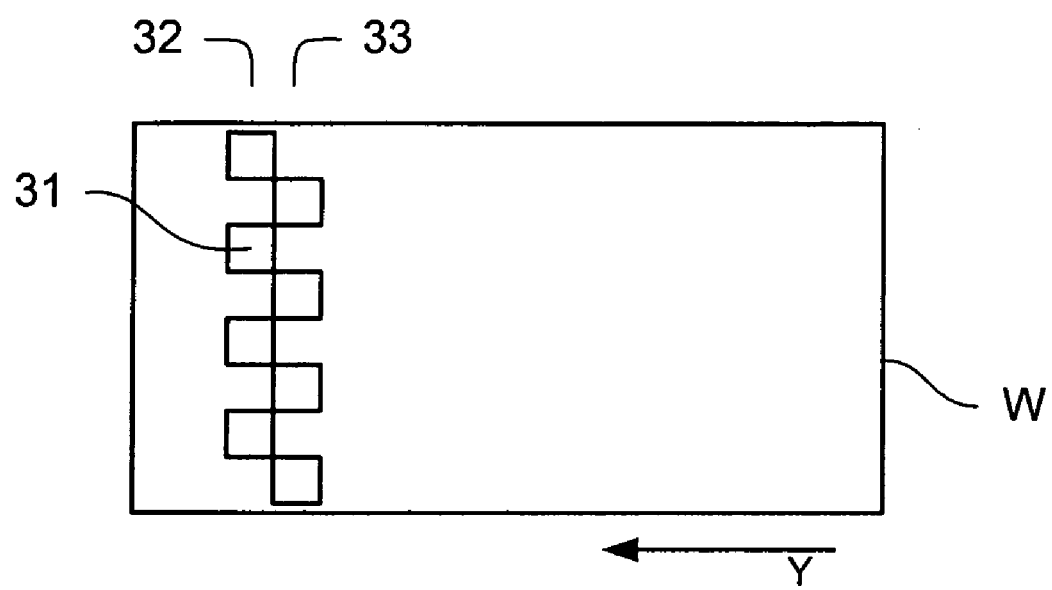
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays 31 of radiation spots S are produced by eight optical engines (not shown), arranged in two rows 32,33 in a "chess board" configuration, such that the edge of one array of radiation spots S slightly overlaps (in the scanning direction Y) with the edge of the adjacent array of radiation spots 15. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

The datapath is configured to provide each of the optical engines with a sequence of control data suitable for producing the portion of the requested dose pattern to be exposed by that optical engine. Each sequence of control data is derived from a portion (or portions) of the requested dose pattern defined by the user. This derivation process typically involves a rasterization step (for example, converting a vector-based definition of the pattern to a bitmap representation) and/or a decompression step, either or both of which can have to be carried out online (i.e., substantially in real time), while the substrate is being exposed. It is not normally possible to produce control data directly from a raw (i.e., uncompressed) bitmap representation of the entire requested dose pattern because this representation would be too large to store all in an easily accessible and cost-effective manner.

A performance of the lithography apparatus is therefore dependent on the speed at which the data manipulation devices can carry out their respective calculations (e.g., rasterization, decompression etc.). For this reason, and because of the scale of the calculations required for typical dose patterns, in one example data manipulation devices are built from specialized computational hardware, optimized for the type of calculations concerned. For example, a massively parallel processing system comprising Field Programmable Gate Arrays can be used.

The complexity of the requested dose pattern can vary considerably from one region of the pattern to another, and is generally not known in advance. Indeed, it is desirable that a user of the lithography apparatus should have complete freedom when choosing the dose pattern. In one example, a choice of pattern should not affect the speed of the lithography process.

As described above, in one example, the patterning process can be divided between a plurality of optical engines. Data manipulation devices can be provided for each optical engine, so as to produce the sequence of control data in parallel for each optical engine.

Figure 5:
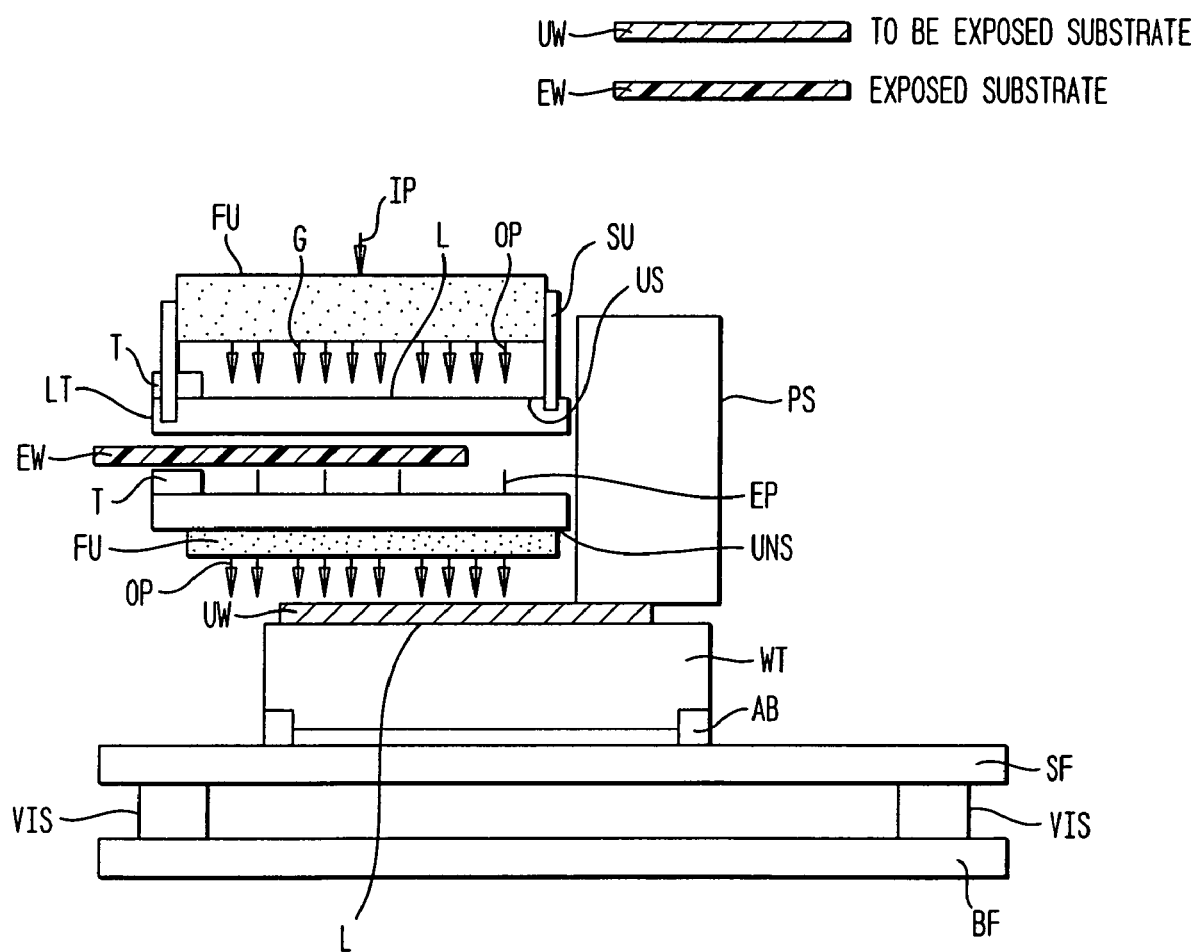

FIG. 5 depicts a side view representation of a clean gas supply system for the lithographic apparatus of an embodiment of the present invention. According to one embodiment, there is provided a clean gas supply system FU, IP, OP for supplying a clean gas to a substrate W, UW, EW. The clean gas supplied can include, but is not limited to, air or nitrogen. The substrate W can be any one of an exposed substrate EW, an unexposed substrate UW, or a partly exposed substrate.

Throughout the Figures, an exposed portion of the substrate is denoted by vertical stripes and an unexposed portion of the substrate is denoted by zig zag stripes.

In one example, the clean gas supply system FU, IP, OP is configured to be located on a moving support LT, UT and is configured to supply a clean gas G to at least one location L at which the substrate W, UW, EW is located. In this way, the clean gas within the apparatus is improved. In particular, clean gas is supplied to areas which, in conventional apparatuses, are poorly supplied.

FIG. 5 shows a frame SF on which the substrate table WT is disposed, between WT and SF, for example, an air bearing AB construction. Further, a metrology frame (not shown) is provided that includes the projection system including the lens. The metrology frame is mounted on the stage frame SF. In order to prevent vibrations from being transmitted through the baseframe BF to the substrate table WT, a vibration isolation system VIS system is disposed between the frame SF and the baseframe BF substrate table WT. The location L, at which a substrate W can be disposed, include locations on the substrate table W and in the substrate handler LT, UT. The substrate handler LT, UT is configured to move the substrate W, UW, EW relative to the substrate table WT, the substrate handler LT, UT being adapted to load substrates LT on to and unload substrates UT from the substrate table WT before and after exposure.

The substrate handler UT, LT comprises at least one of a loader table LT and an unloader table UT. The substrate handler can also include a transporter for facilitating the transport of the substrates to and from the unloader and loader tables, respectively. The substrate handler can also include e-pins EP, for supporting the substrate on the unloader and loader tables LT, UT, respectively.

In one example, a clean gas supply system FU, IP, OP is disposed above the loader table LT to supply the clean gas to an unexposed substrate during thermal preconditioning of the unexposed substrate.

In a further example, as shown in FIG. 5, a clean gas supply system FU is disposed below the unloader table UT to supply the clean gas to the unexposed substrate UW during at least one of scanning and exposing of the substrate UW on the substrate table WT. In this way, an overpressure is created which prevents airborne particles from reaching, in particular, unexposed substrates UW. This can be achieved with a relatively low impact on the cost of goods. Further, a conditioned environment is created at the location at which the substrate W, UW, EW is disposed in the apparatus. The location of the conditioned environment can be controlled to improve the efficiency with which clean gas in the apparatus is utilized. In this way, certain specific areas, for example, the environments in which unexposed substrates are disposed, can be conditioned in an improved manner. In this way, an improved particular contamination performance is achieved, which results in an improved customer yield and an improved cost of ownership. This is particularly desirable in apparatuses that are arranged to produce devices having a large image area, such as flat panel displays. In flat panel display manufacture, the flat panel display to integrated circuit (FPD/IC) ratio is about $(500\times400~mm^2)/(26\times32~mm^2)$, which is equal to about 240. The ratio can vary however, from about 0.1 to around 1000.

As mentioned, the clean gas supply system FU, IP, OP is configured to supply a clean gas G to at least one location L at which a substrate is located. Further details of the clean gas supply system are shown and described with reference to FIG. 10.

In one example, the clean gas supply system FU, IP, OP is moveably mounted. In one example, the clean gas supply system FU, IP, OP is mounted on the substrate handler LT, UT. Further, the clean gas supply system FU, IP, OP can move together with the substrate handler LT, UT. The substrate handler can comprise at least one of a loader table LT and an unloader table UT.

In one example, the clean gas supply system FU, IP, OP is mounted on an upper side US of the substrate handler LT. In particular, on an upper side US of the loader table LT.

The clean gas supply system is configured to direct clean gas G towards a location L on the at least one of a loader and unloader table UT where a substrate can be located. In the embodiment shown in FIG. 5, no substrate is shown in the location L on the loader table LT. However, as will be described with reference to the exemplary sequence of FIG. 6a to 6g, during the cycle, a substrate is brought to this location for loading to the substrate table WT. The loader table LT is arranged to load a substrate on the substrate table WT. The unloader table LT is arranged to unload a substrate from the substrate table WT.

In a further example, the clean gas supply system FU, IP, OP is mounted on an underside UNS of the substrate handler UT. In particular, on an underside UNS of the unloader table UT, and is configured to direct clean gas towards a location on the substrate table WT where a substrate UW is located.

In one example, a support SU can be provided for supportably mounting the clean gas supply system FU, IP, OP on the substrate handler LT, UT. The support can be constructed of any material suitable to support the clean gas supply system. For example, it can be a metal structure, for example, steel. In particular, the support is configured to supportably mount the clean gas supply system on the at least one of a loader table LT and an unloader table UT.

In the embodiment shown in FIG. 5, the support SU for the filter unit FU is disposed on the loader table. Further, the second filter unit is disposed on the underside UNS of the unloader table. The clean gas supply system is a conventional system. It can comprise a filter unit FU. The filter unit comprises a gas inlet and a clean gas outlet. The filter unit FU takes gas and filters it. The filtered gas typically has a temperature of about 23 degrees Celcius +/−0.2 degrees Celcius. The filtered gas is output via the outlet as clean gas. The clean air is particle filtered air. In one example, critical particles for flat panel display manufacture are larger than or equal to about 0.5 μm. In one example, the clean air in flat panel display manufacture is ISO 14644 class 2.

In one example, the gas taken in via the inlet can be taken from the outside environment. Alternatively, it can be recycled. The filter unit FU is moveably mounted on the substrate handler. As seen in more detail in FIGS. 6 to 12, the substrate handler is moveable in a direction substantially perpendicular to a plane in which the substrate is disposed at the location.

In conventional lithographic apparatuses, it has been found that one particular problem area is formed in the volume underneath the unloader and the substrate on the substrate table during an exposure of typically about 45 seconds. The underside of the unloader table UT can typically be about 40 mm from the surface of the substrate. In conventional lithographic apparatuses, no direct clean air is provided above the unexposed substrate disposed below the unloader table. As described above, this problem is addressed by at least one embodiment of the present invention through the provision of the clean gas supply system disposed on the underside of the unloader table UT. It has been found that this arrangement reduces contamination of the unexposed substrate, and hence increases imaging quality.

In conventional lithographic apparatuses, a further particular problem area is the area above the unexposed substrate on the loader table LT. Due to the movement of the substrate handler in the Z direction, there is a decreasing and increasing volume, i.e., fluctuating volume, above the unexposed substrate on the loader table. Because of the movement in the Z direction, an air current is created in the apparatus, resulting in a contamination risk for airborne particles. The risk of contamination is further increased by the movement of the substrate table. These problems are further exacerbated in apparatuses for manufacturing flat panel displays, where the sizes of the substrate, substrate table and substrate handlers are relatively large. This further problem is addressed according to an embodiment of the present invention, by the provision of a clean gas system above the loader table, and which is further arranged to move together with the substrate handler.

Figure 6A:
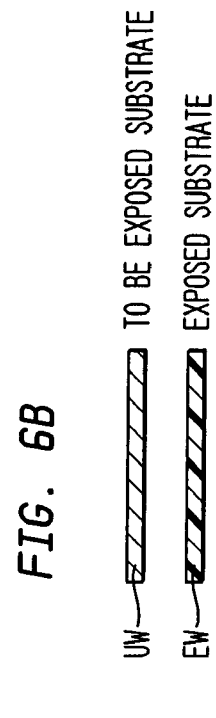
Figure 6B:
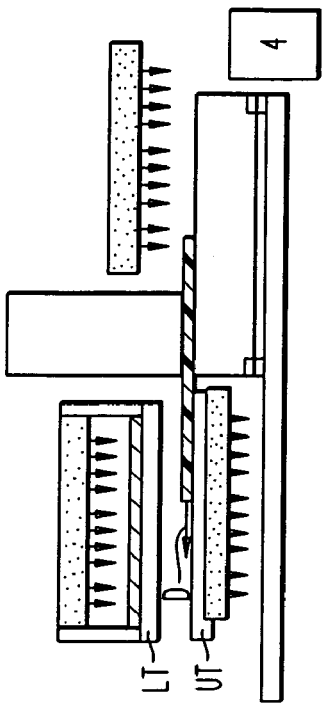

FIGS. 6a to 6g depict side view representations of a clean gas supply sequence, according to one embodiment of the present invention. In the embodiments shown in FIGS. 5 and 6a to 6g, a loader table LT and an unloader table UT are provided which are dedicated to the specific functions of either loading or unloading can be provided. However, in alternative embodiments, non-dedicated tables can be used. For example, whether a loader table and an unloader table is described as being one or the other, depends on the stage of the sequence. Thus, at one stage in the sequence, the table shown upper most in FIGS. 5 and 6a to 6g can be designated as a loader table, and at a further stage in the sequence, the same table can be designated as an unloader table. In such embodiments shown, the construction of the loader and unloader tables is substantially the same and as mentioned denoted by the function of the table at a particular stage in the sequence. In the sequence depicted by FIGS. 6a to 6g, the apparatus components correspond to those shown and described with reference to FIG. 5. In FIGS. 6a, 6b, a lamp is shown in the projections system PS, to indicate that during these parts of the sequence exposure is taking place.

FIG. 6a shows stage 1 of the sequence. FIG. 6a shows a substrate table WT in a starting position supporting an unexposed substrate UW1 underneath a projection system PS, such as a scanner. The substrate table WT moves in a direction indicated by arrow A underneath the scanner, thereby irradiating the substrate W. While scanning takes place, previously exposed substrate EW is now unloaded by a robot (not shown) in a direction indicated by arrow B. While the exposure of the unexposed substrate takes place, the filter unit FU2 directs clean air onto the substrate.

FIG. 6b shows stage 2 of the sequence. FIG. 6b shows the substrate table WT continuing to move in a direction shown by arrow A, such that the substrate UW1 continues to be scanned. While scanning continues a further unexposed substrate UW2 is loaded by a robot (not shown) on to the loader table LT. During loading and once loaded, filter unit FU1 directs clean air towards the further unexposed substrate UW2. Thus, reducing the risk of contamination of the unexposed wafer. In FIGS. 6a and 6b, an e-pin mechanism aids the facilitation of the loading and unloading of the substrates to and from the loader and unloader tables, respectively.

Figure 6C:
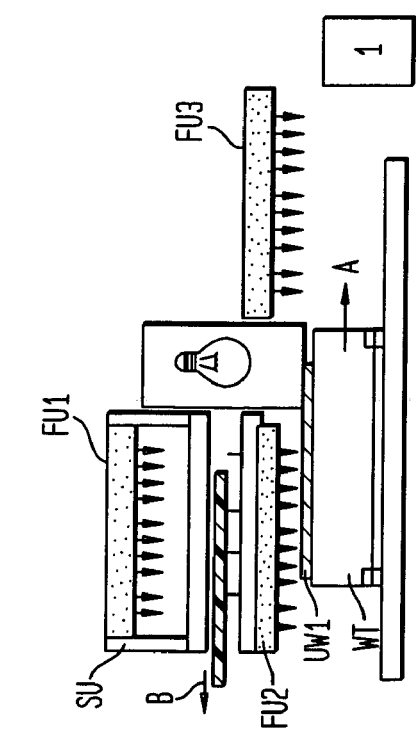

FIG. 6c shows stage 3 of the sequence. FIG. 6c shows the substrate table WT in its most extreme "end" position, such that the entire surface of the substrate UW2 has been completely scanned. It will be noted that the unexposed substrate UW1 is now denoted as an exposed substrate EW1. This makes sufficient room for the substrate handler LT, UT on which the clean gas supply systems FU1, FU2 are disposed, to be lowered down in a direction as indicated by arrow C to the scanning level.

Figure 6D:
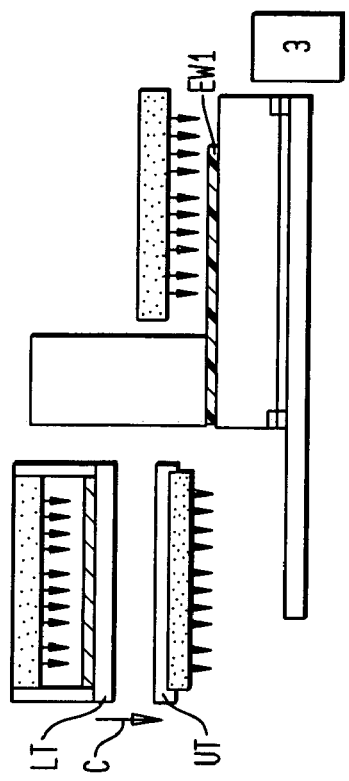

FIG. 6d shows stage 4 of the sequence. FIG. 6d shows the substrate handler LT, UT in a position such that the unloading table has moved down so that it is substantially level with the upper surface of the substrate table WT on which the exposed substrate EW1 is disposed. Once in this position, the exposed substrate EW1 is unloaded from the substrate table WT on to the unloader table UT in a direction indicated by arrow D.

Figure 6E:
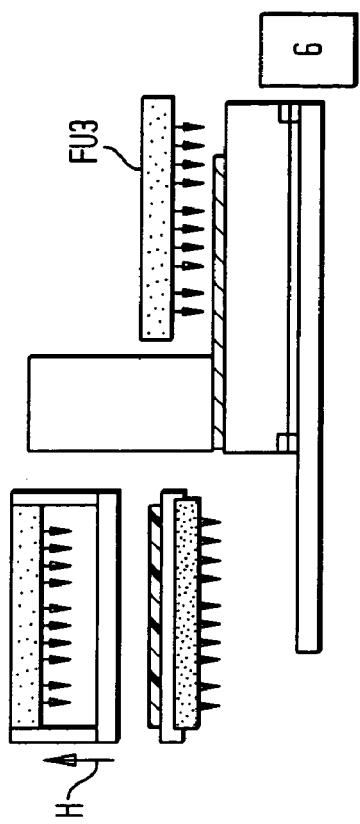

FIG. 6e shows stage 5 of the sequence. Once the exposed substrate EW1 is on the unloader table UT, the substrate handler is moved further downwards in a direction indicated by arrow E until the upper surface of the loader table LT is substantially flush with the upper surface of the substrate table WT. Once the upper surfaces are substantially flush, the second unexposed wafer UW2 which was loaded onto the loader table LT in step 2 is loaded onto the substrate table WT where it is subsequently exposed. The unloader table UT is arranged to move the second unexposed substrate UW2 in a direction indicated by arrow F.

Figure 6F:
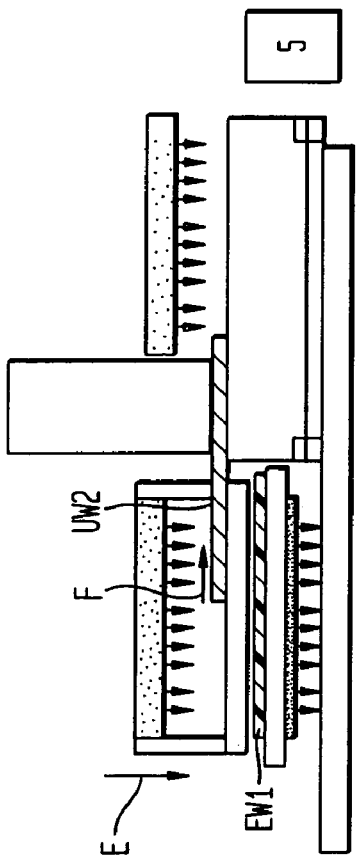

FIG. 6f shows stage 6 of the sequence. Once the unexposed substrate UW2 has been loaded onto the substrate table WT, the substrate table WT waits at the exchange position while the substrate handler is moved in an upward direction as shown by arrow H. In order to reduce the risk of contamination of the second unexposed substrate UW2, the filter unit FU3 is arranged to direct clean air onto the surface of the unexposed substrate while the substrate is held at the exchange position and while the substrate handler is moved upwards. The substrate handler is moved upwards until the filter unit FU2 disposed on the underside of the unloader table UT is in a position to be able to direct clean air onto the unexposed substrate once it is moved to the expose position.

Figure 6G:
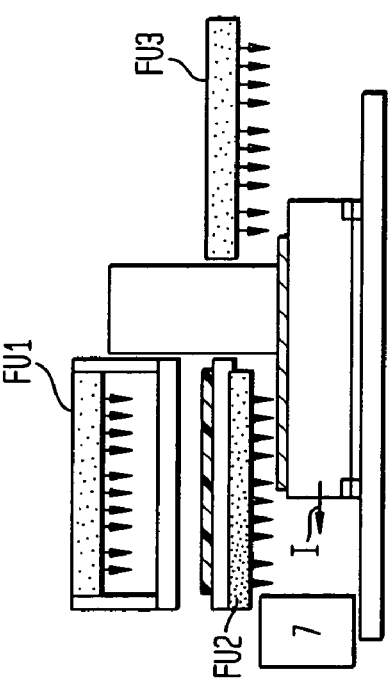

FIG. 6g shows stage 7 of the sequence. Once the substrate handler has moved up, as shown in FIG. 6f, the substrate table WT is moved to the expose position by moving the substrate table in the direction of arrow I. In order to further reduce the risk of contamination of the still unexposed substrate UW2, the filter unit FU2 is arranged to direct clean air onto the substrate while the substrate table moves to the expose position. In this way, the risk of contamination is further reduced. After stage 7, the sequence returns to stage 1, as shown in FIG. 6a. The sequence repeats.

Figure 7:
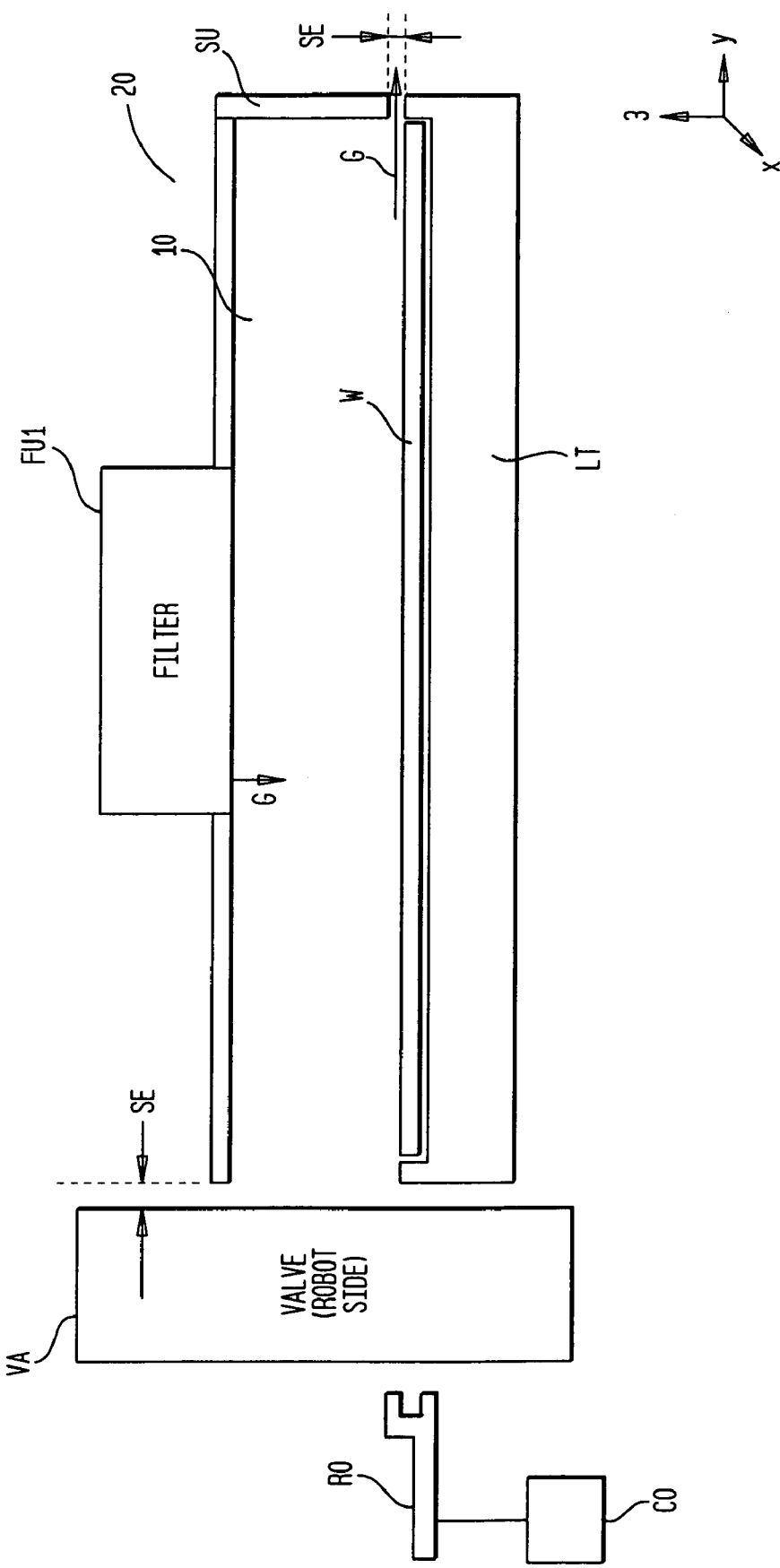

FIG. 7 depicts a side view representation of a clean gas supply system for a lithographic apparatus, according to a further embodiment of the present invention. In particular, FIG. 7 shows details of the substrate handler including the loader table LT. The substrate handler can further comprise a robot arm RO for at least one of disposing and removing a substrate on or from, respectively, at least one of the loader and the unloader table. The robot arm RO is controlled by a controller circuit CO.

In FIG. 7, the robot arm RO is arranged to dispose the substrate W on the loader table LT. In order to maintain a clean environment around the substrate, a valve VA can be provided between the at least one of the loader and unloader table LT, UT and the robot arm RO. The value VA is configured to selectively allow the robot arm access to the at least one of the loader and unloader table. In FIG. 7, the valve VA is in the closed position. In order to allow the robot arm RO access to the loader table, the valve VA is moved, for example, upwards or downwards. In other words, the loader and unloader tables LT, UT can be considered as being boxes which are closable with the valve VA. The valve can be combined with a further valve which closes the lithographic apparatus off from the cleanroom, i.e., the interface with the substrate processing track. In one embodiment, the filter unit FU1, FU2 and the valve VA are configured to provide a clean gas environment around the substrate.

The cleanliness of the environment 10 around the substrates in the lithographic apparatus can be further improved by at least one seal SE. A seal SE can be disposed between the at least one loader and unloader table LT, UT and the valve VA. The seal being configured to seal an environment within which the substrate is disposed from an outside environment. This can be done by creating an overpressure in the environment in which the substrate is located with respect to the outside environment. The seal SE can be formed by a gap between the filter unit FU1 and the valve VA. A further seal can be provided between the loader table LT and the support SU on which the filter unit FU1 is mounted. For example, the seal can comprise a gap formed in the support SU which supports the clean gas supply system on the substrate handler.

The clean gas supply system is configured to supply gas to the environment within which the substrate is disposed. In FIG. 7, the gas is supplied by the filter unit FU1. The gas flows as indicated by arrow G. The gap is dimensioned so that a controlled leak of gas occurs from the environment 10 to the outside 20. By allowing a certain amount of gas to escape from the environment, gas, which can be contaminated, from the outside 20 is hindered from entering the environment 10.

In one embodiment, the seal is configured to allow clean gas to leak from the environment within which the substrate is disposed and to prevent gas from the outside environment from entering the environment within which the substrate is disposed. For example, the seal can comprise a gap dimensioned so that the gas in the environment within which the substrate is disposed has preferably a laminar flow at the gap. For laminar flow, the Reynolds number may not exceed a critical value that depends on the geometry. The Reynolds number is calculated in the conventional way using the equation (1):

$$Re = \frac{\rho D V}{\mu},$$

where Re is the Reynolds number, rho is the fluid density, D is the typical distance, V is the fluid velocity and mu μ is the fluid viscosity. The velocity of the air at the gap is around 1.5 meters per second. To achieve laminar flow at the gap, the gap can be around 15 millimeters. If the flow is too slow, gas can leak in from the outside. Further, if the flow is too high, the flow at the gap can become turbulent, which also increases the risk of unclean gases entering the environment 10.

In FIG. 7, two seals are shown. In one embodiment, the seals have the same gap dimensions. In this way homogenous flow is achieved. In an alternative embodiment, the gaps can have differing dimensions. It follows from equation (1), that if the size of the gap is increased, the velocity of the air leaving the filter unit FU will be increased in order to maintain laminar flow.

Figure 8:
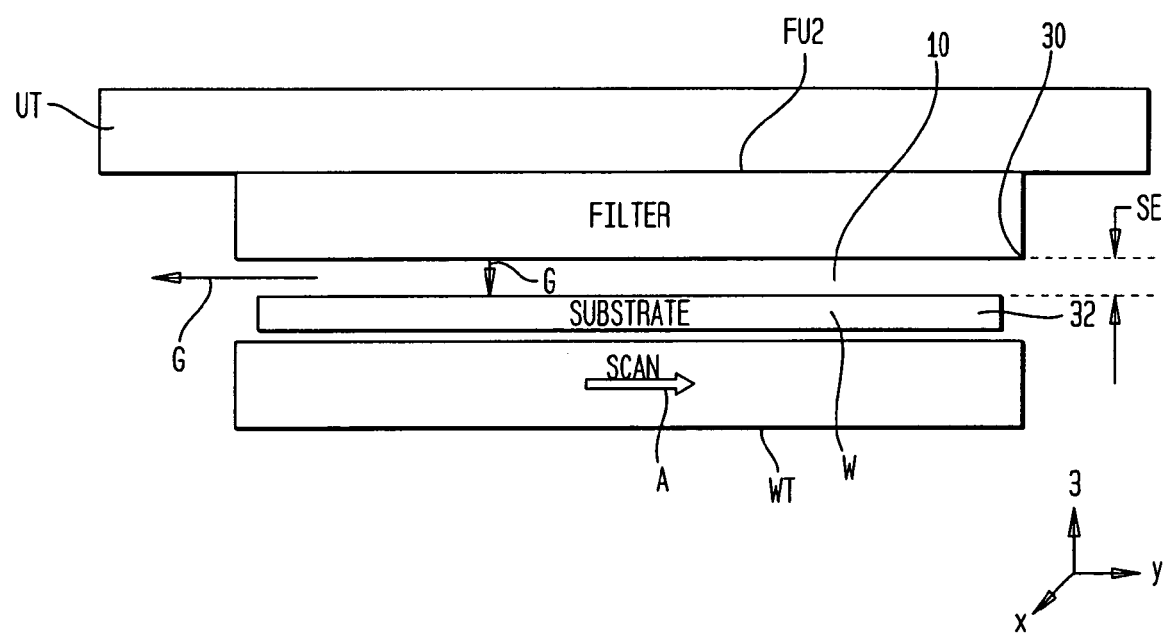

FIG. 8 depicts a side view representation of a clean gas supply system for a lithographic apparatus, according to a yet further embodiment of the present invention. In particular, FIG. 8 shows details of the substrate handler, including the unloader table UT, on which a filter unit FU2 is mounted on the underside thereof. The unloader table UT provides a rigid and stable mounting location for the filter unit FU2.

As shown in FIG. 8, the substrate table is arranged to perform a scanning movement in a direction indicated by arrow A. In the embodiment shown in FIG. 8, the seal is moving as the substrate table WT is moving under the projection lens PS. The moving seal is formed by disposing the filter unit FU2 relatively close to the substrate, for example, around 15-25 millimeters from the substrate, on the substrate table WT. This arrangement generates a seal between the front edge of the substrate 32 and the front edge of the filter unit 30. In particular, the location of the seal SE with respect to the substrate table WT moves. As the substrate table WT moves in the scanning direction, the moving seal SE with respect to the substrate table WT is formed by a front edge 32 of the substrate disposed on the substrate table and the clean gas supply system FU. The lower front edge 30 of the filter unit FU2 can also be shaped in order to further contribute to maintaining a seal of the environment 10.

In one example, the size of the gap in the embodiment shown in FIG. 8 is around 15 to 25 millimeters. Depending on the speed of the substrate table WT, the gas flow G from the filter unit FU2 will be adapted. The substrate table WT is moved at different speeds depending on whether it is moved during scanning or during the idle stroke. The scan velocity is relatively low, for example, it can be around 50-100 millimeters per second. The idle stroke velocity, however, is relatively fast, for example, it can be around 1 meter per second. During the idle stroke, for example, the laminar gas flow at the gap, in order to maintain the seal, is larger than the idle stroke velocity.

Figure 9:
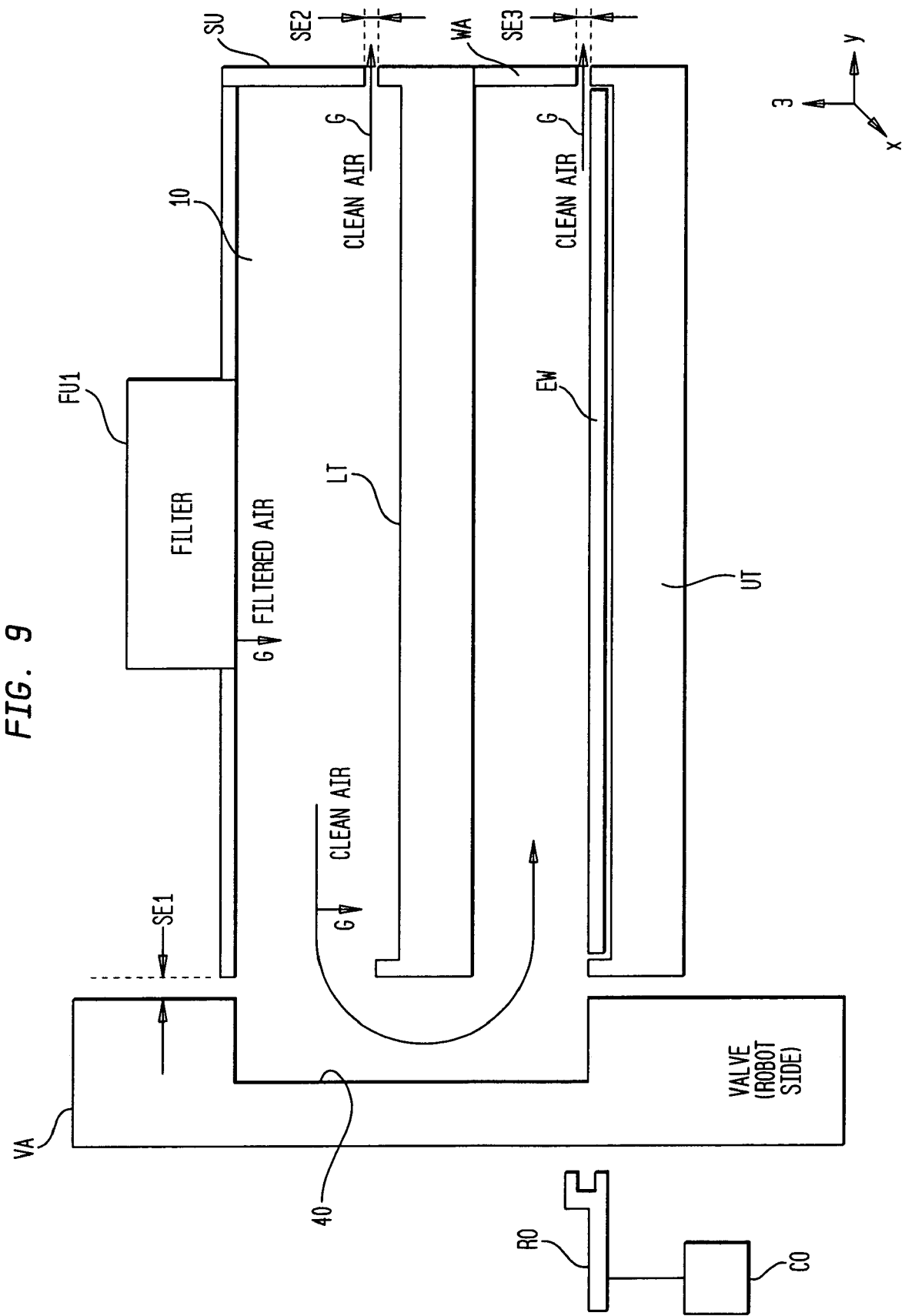

FIG. 9 depicts a side view representation of a clean gas supply system for a lithographic apparatus, according to a still yet further embodiment of the present invention. In particular, FIG. 9 shows details of the substrate handler including the loader table LT, on which a filter unit FU1 is mounted, the unloader table UT, and a valve, which is constructed to allow clean gas emitted from the filter unit FU1 to be directed towards an exposed substrate EW disposed on the unloader table UT. Thus, in this embodiment, although no active mini environment is provided specifically around the exposed substrate EW, the valve is used to transport the clean gas from the filter unit FU1 over the exposed substrate EW. The valve VA can operate in a manner described with reference to FIG. 7. In addition, however, the valve is provided with a recess 40 so that the filtered gas G leaving the filter unit FU1 can pass around the loader table LT to thus access the exposed substrate EW. In one example, the valve can be constructed to allow a gas from the filter unit FU1 mounted on the loader table LT to be directed to a substrate EW disposed on the unloader table. Further, the valve VA can include a recess 40 through which the gas passes in order to pass around the loader table, to direct the gas to the unloader table.

A plurality of seals SE1, SE2, SE3 are provided to contain the environment 10. A first seal SE1 is provided between the filter unit FU1 and the valve VA. A second seal is provided between the loader table LT and the support SU, on which the filter unit FU1 is mounted. A third seal SE3 is provided between the unloader table UT and a wall portion WA of the substrate handler. The seals can be constructed in the manner described above with reference to FIG. 7. The seals can all be the same in order to establish homogeneous flow. However, this is not necessary.

FIG. 10 shows details of the clean gas supply system, according to one embodiment of the present invention. The clean gas supply system can include at least one of a filter unit FU for filtering a gas, a heat-exchanger HE for thermally conditioning the gas to be filtered, a fan unit FA for controlling the flow rate of the gas and a chemical filter CF for chemically filtering the gas. A gas is taken, for example, from the outside environment to an inlet valve IN. The gas can initially be chemically filtered before it passes through the fan unit FA. It can also be thermally conditioned before it passes through the filter unit FU. The order in which the gas is filtered, thermally conditioned, and passed through the fan can vary depending on the circumstances. In one example, the heat exchanger HE can be disposed either upstream or downstream from the filter unit FU.

In the embodiment shown in FIG. 10, the units FU, HE, FA, CF of the clean gas supply system are all mounted as a moving unit on the support SU mounted on the loader table LT. In alternative embodiments, at least one of the heat exchanger HE, the fan unit FA and the chemical filter CF can be located remotely with respect to the filter unit. For example, elsewhere in the lithographic apparatus.

In one embodiment, the filter unit FU is movably mounted on the loader table, while the heat exchanger HE, fan unit FA and chemical filter CF are located elsewhere. In a further embodiment, the filter unit FU and heat exchanger HE are movably mounted on the loader table LT, while the fan unit FA and the chemical filter CF are located elsewhere. In a yet further embodiment, the filter unit FU, the heat exchanger HE and the fan unit FA are movably mounted on the loader table LT, while the chemical filter CF is located elsewhere. In the embodiments where at least one of the units is located elsewhere, a supply element is provided to supply the gas from the remotely located unit or units to the movably mounted unit or units. By disposing the units of the clean gas supply system either on the movable loader table LT or else wherein the apparatus, the efficiency with which the limited space in the lithographic apparatus can be utilized is optimized depending on each particular apparatus.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

Although specific reference can have been made above to the use of embodiments of the present invention in the context of optical lithography, it will be appreciated that the present invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it will be appreciated that the present invention can be practiced otherwise than as described. For example, the present invention can take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus comprising:
a substrate table that supports a substrate;
a substrate handler that moves the substrate relative to the substrate table, the substrate handler being adapted to load substrates to be exposed on to and unload substrates that have been exposed from the substrate table before and after an exposure, respectively, and
a clean gas supply system that supplies a clean gas by filtering a fluctuating air volume caused due to a movement of the substrate handler carrying the substrates to at least one location at which a substrate is located during the exposure, wherein the clean gas supply system is moveably mounted.

2. The lithographic apparatus of claim 1, wherein the clean gas supply system is mounted on the substrate handler.

3. The lithographic apparatus of claim 1, wherein the clean gas supply system moves together with the substrate handler.

4. The lithographic apparatus of claim 1, wherein the substrate handler comprises at least one of a loader and an unloader table.

5. The lithographic apparatus of claim 4, wherein the clean gas supply system is mounted on an upper side of the substrate handler and directs clean gas towards a location on the at least one of the loader and unloader table where the substrate is located.

6. The lithographic apparatus of claim 1, wherein the clean gas supply system is mounted on an underside of the substrate handler and directs clean gas towards a location on the substrate table where the substrate is located.

7. The lithographic apparatus of claim 4, further comprising a support that supportably mounts the clean gas supply system on the substrate handler.

8. The lithographic apparatus of claim 7, wherein the support supportably mounts the clean gas supply system on the at least one of the loader and the unloader table.

9. The lithographic apparatus of claim 1, wherein the clean gas supply system comprises:
a filter unit comprising a gas inlet and a clean gas outlet, wherein the filter unit is moveably mounted on the substrate handler.

10. The lithographic apparatus of claim 9, wherein the filter unit is at least one of a particle filter unit and a chemical filter unit.

11. The lithographic apparatus of claim 1, wherein the substrate handler is moveable in a direction substantially perpendicular to a plane in which the substrate is disposed at the location.

12. The lithographic apparatus of claim 4, wherein the substrate handler comprises:
a robot arm for at least one of disposing and removing the substrate on or from, respectively, at least one of the loader and the unloader table.

13. The lithographic apparatus of claim 12, further comprising:
a valve provided between the at least one of the loader and unloader table and the robot arm, the valve selectively allowing the robot arm access to the at least one of the loader and unloader table.

14. The lithographic apparatus of claim 13, further comprising:
a seal disposed between the at least one of the loader and unloader table and the valve, the seal performing sealing within an environment in which the substrate is disposed from an outside environment.

15. The lithographic apparatus of claim 14, wherein the clean gas supply system supplies gas to the environment within which the substrate is disposed.

16. The lithographic apparatus of claim 15, wherein the seal allows clean gas to leak from the environment within which the substrate is disposed and to prevent gas from the outside environment from entering the environment within which the substrate is disposed.

17. The lithographic apparatus of claim 16, wherein the seal is formed by creating an overpressure in the environment with respect to an outside environment.

18. The lithographic apparatus of claim 16, wherein the seal comprises a gap dimensioned so that the gas in the environment within which the substrate is disposed has a laminar flow at the gap.

19. The lithographic apparatus of claim 14, wherein the location of the seal with respect to the substrate table moves.

20. The lithographic apparatus of claim 19, wherein during a scanning movement of the substrate table, the moving seal is formed by a front edge of the substrate disposed on the substrate table and the clean gas supply system.

21. The lithographic apparatus of claim 14, wherein the seal comprises a gap formed in the support which supports the clean gas supply system on the substrate handler.

22. The lithographic apparatus of claim 1, wherein the clean gas supply system comprises at least one of a filter unit for filtering a gas, a heat-exchanger for thermally conditioning the gas, a fan unit for determining a flow of the gas, and a chemical filter for chemically filtering the gas.

23. The lithographic apparatus of claim 22, wherein at least one of the heat exchanger, the fan unit, and the chemical filter are remotely located with respect to the filter unit.

24. The lithographic apparatus of claim 23, wherein the at least one of the heat exchanger, the fan unit, and the chemical filter are located within the lithographic apparatus.

25. The lithographic apparatus of claim 1, wherein the apparatus further comprises:
an illumination system that conditions a radiation beam;
a patterning device that modulates the radiation beam; and
a projection system that projects the modulated radiation beam onto a target portion of the substrate.

26. A device manufacturing method, comprising:
conditioning a radiation beam;
modulating the radiation beam;
supporting a first substrate on a substrate table;
projecting the modulating radiation beam onto a target portion of the first substrate,
moving the first substrate relative to the substrate table, including loading the first substrate on to and unloading the first substrate from the substrate table before and after an exposure, respectively; and
supplying a clean gas by filtering a fluctuating air volume caused due to the loading and the unloading to at least one location at which the first substrate is located during the exposure, wherein the clean gas is supplied by a moveably mounted clean gas system.

27. The method of claim 26, wherein the supplying occurs while a second exposed substrate is being unloaded out of the device.

28. The method of claim 26, the supplying comprises filtering.

29. The method of claim 26, further comprising:
disposing and removing the substrate after the exposure by the projected beam on or from, respectively, at least one of a loader and an unloader table using a robot arm.

30. The method of claim 29, comprising selectively allowing the robot arm access to the at least one of the loader and the unloader table by opening or closing a valve provided between the at least one of the loader and the unloader table and the robot arm.

31. The method of claim 30, comprising disposing a seal between the at least one of the loader and the unloader table and the valve for sealing an environment in which the first substrate is exposed from an outside environment.

32. The method of claim 26, wherein the supplying comprises supplying the clean gas for creating an over-pressure in an environment in which the first substrate is exposed relative to an outside environment.

33. The method of claim 26, wherein the supplying is performed above and/or below the first substrate.

34. The method of claim 26, wherein the supplying occurs while the first substrate is being exposed and a second substrate to be exposed is being loaded for a subsequent exposure.

35. The lithographic apparatus of claim 1, wherein the clean gas is obtained by filtering air displaced by a movement of the substrate.

* * * * *